(12) United States Patent
van Rhijn

(10) Patent No.: US 6,590,452 B1
(45) Date of Patent: Jul. 8, 2003

(54) HIGH DC GAIN CASCODE AMPLIFIER STAGE WITH LOW NOISE PERFORMANCE

(75) Inventor: Arie J. van Rhijn, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/160,525

(22) Filed: May 31, 2002

(51) Int. Cl.[7] ................................................. H03F 3/45
(52) U.S. Cl. ........................ 330/253; 330/257; 330/260
(58) Field of Search ................................. 330/253, 257, 330/260, 261

(56) References Cited

U.S. PATENT DOCUMENTS 5,748,040 A * 5/1998 Leung ........................ 330/253
6,150,883 A * 11/2000 Ivanov ....................... 330/253
6,353,361 B1 * 3/2002 Sun ............................ 330/253
6,356,153 B1 * 3/2002 Ivanov et al. ............... 330/253

* cited by examiner

Primary Examiner—Henry Choe
(74) Attorney, Agent, or Firm—Brett A. Hertzberg; Merchant & Gould

(57) ABSTRACT

A cascode stage includes a gain boost circuit arrangement in a folded cascode type of operational amplifier. The gain boost circuit arrangement improves the overall DC gain of the operational amplifier while maintaining good low noise performance with the resistive loads. The cascode stage includes a current mirror circuit, resistive loads, and a regulated (or gain boosted) cascode circuit. The resistive loads are arranged to minimize thermal noise, while the regulated cascode circuit is arranged to increase the output impedance of a current mirror The increased output impedance results in higher DC gain in the operational amplifier. The increased DC gain and low noise characteristics may be implemented in bipolar and FET technologies.

12 Claims, 2 Drawing Sheets

HIGH DC GAIN CASCODE AMPLIFIER STAGE WITH LOW NOISE PERFORMANCE

FIELD OF THE INVENTION

The present invention is related to operational amplifier technology. More particularly, the present invention is related to an amplifier that includes a cascode stage exhibiting properties of high DC gain and low thermal noise.

BACKGROUND OF THE INVENTION

An integrated amplifier circuit such as an operational amplifier (op-amp) is usually constructed as an integrated circuit. The operational amplifier includes an array of active and/or passive components that are connected together to form a functioning circuit. Typically, input signals are provided to the integrated amplifier circuit via selected input pins. The operational amplifier typically includes multiple-stages such as an input stage, and an output stage.

An input stage for a conventional CMOS folded cascode operational amplifier (100) is illustrated in FIG. 1. Input stage 100 includes metal oxide semiconductor (MOS) transistors M101–M106, and current sources I101–I103. Transistor M101 has a source that is coupled to node N103, a gate that is coupled to input terminal INM, and a drain that is coupled to node N101. Transistor M102 has a source that is coupled to node N103, a gate that is coupled to input terminal INP, and a drain that is coupled to node N102. Transistor M103 has a source that is coupled to node N101, a gate that is coupled to bias voltage V101, and a drain that is coupled to node N105. Transistor M104 has a source that is coupled to node N102, a gate that is coupled to bias voltage V101, and a drain that is coupled to node N104. Transistor M105 has a source that is coupled to power supply VDD, a gate that is coupled to node N105, and a drain that is coupled to node N105. Transistor M106 has a source that is coupled to power supply VDD, a gate that is coupled to node N105, and a drain that is coupled to node N104. Current source I101 is coupled between VDD and node N103. Current source I102 is coupled between node N102 and VSS. Current source I103 is coupled between node N101 and VSS.

Transistors M101 and M102 cooperate with current source I101 to operate as a differential pair circuit in the input stage. The differential pair circuit is responsive to a differential signal that is applied across the INP and INM input terminals. Transistors M103–M106 and current sources I102–I103 are arranged to operate as a cascode circuit in the input stage. Node N104 is a high impedance node that drives additional stages (not shown) in the amplifier circuit. The differential pair and the cascode stage cooperate with one another to provide gain in response to the input signals based on their difference. The output of the cascode stage corresponds to node N104, which may be used to drive another stage of the amplifier.

SUMMARY OF THE INVENTION

Briefly stated, a cascode stage in the present invention includes a gain boost circuit arrangement in a folded cascode type of operational amplifier. The gain boost circuit arrangement improves the overall DC gain of the operational amplifier while maintaining good low noise performance with the resistive loads. The cascode stage includes a current mirror circuit, resistive loads, and a regulated (or gain boosted) cascode circuit. The resistive loads are arranged to minimize thermal noise, while the regulated cascode circuit is arranged to increase the output impedance of a current mirror. The increased output impedance results in higher DC gain in the operational amplifier. The increased DC gain and low noise characteristics may be implemented in bipolar and FET technologies.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Figure 1:
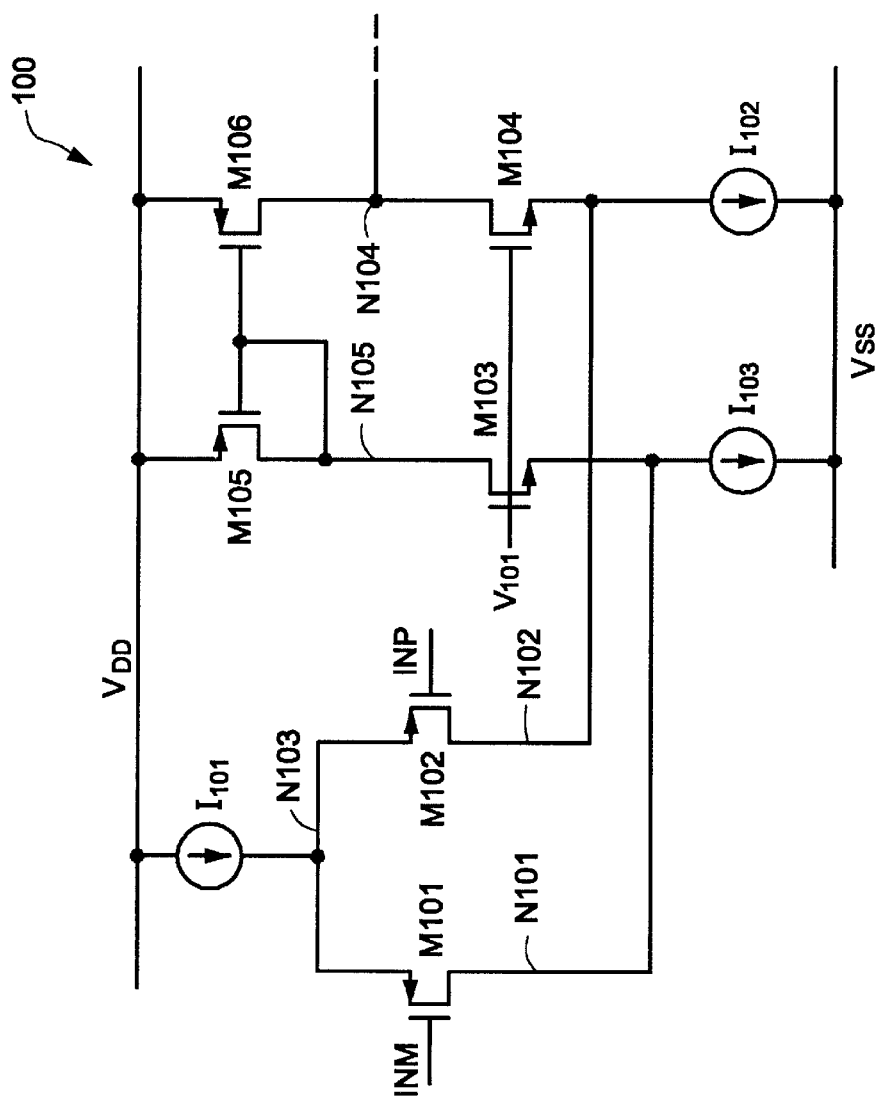
FIG. 1 is a schematic diagram of a portion of a conventional operational amplifier.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

In accordance with the present invention, a cascode stage is arranged to provide for high DC gain and low noise in a folded cascode type of operational amplifier. Resistor loads are employed to minimize noise characteristics in the cascode stage. Transistors are arranged to operate as regulated cascode transistors that increase the output impedance of a current mirror. The increased output impedance results in increased DC gain. The increased DC gain and low noise characteristics may be implemented in bipolar and FET technologies. The operational amplifier may be implemented as an integrated circuit that has minimum die size.

Thermal noise is one type of noise source in a low noise amplifier. Passive devices such as resistors have a thermal noise characteristic that is a function of the operating temperature of the resistor. Thermally excited electron currents flow in the resistor in a relatively random fashion, and providing a statistically averaged noise voltage across the resistor. The thermal noise in a resistor is a white noise in that the noise characteristics are relatively constant over the entire operating frequency range of the resistor. Active devices such as transistors (e.g., bipolar junction transistors, field effect transistors, etc.) also generate noise such as shot noise and flicker noise.

Shot noise is predominately due to the discrete nature of charge carriers and the statistical nature of charge flow in semiconductor devices. Each electron has an associated charge that results in a current pulse. Electrons move in a random manner as they cross a potential barrier in the semiconductor device such that a random noise characteristic is observed in the current flow. Shot noise is thus determined as a function of electron charge, magnitude of the current flow, and linearly dependent on the frequency of the electrons crossing the barrier.

Flicker noise (aka 1/f noise) is a random noise phenomenon that is generally due to the imperfect processing of the crystal lattice structure in a semiconductor device. Defects and/or abrupt transitions in the crystal lattice structure result in an irregular conduction paths for charge carriers in the device. A rough surface can result in currents traveling at different speeds based on their location within the semiconductor device, resulting in an uncertainty in the total current flowing in the device. The flicker noise contribution has a 1/f slope such that flicker noise is negligible at high frequencies. The noise density increases as the frequency drops. Field effect devices (e.g., MOSFETs) are surface devices that suffer from high flicker noise characteristics since their currents flow near the surface of the device. Bipolar junction transistors generally have lower flicker noise since the primary conduction of the device is not near the surface of the device.

The overall noise performance of the operational amplifier depends largely on the topology employed. Each source of noise in a particular section of the operational amplifier may be amplified by a subsequent stage of the amplifier. As a consequence of the gain in the operational amplifier circuit, conventional high gain operational amplifier tends to have high noise levels, while low gain operational amplifiers tend to have lower noise levels. The transconductance of transistors in the input differential pair circuit and the impedance of the load devices to which they are connected determine the gain of the input stage in a conventional operational amplifier. Since resistors tend to provide lower noise levels than transistors, resistors are preferred in low noise applications resulting in overall lower gain levels.

In accordance with the present invention, a low noise high DC gain topology is employed for an operational amplifier. Resistors are employed by the cascode stage of the present invention to minimize the noise contributions from the load devices. A gain boost circuit arrangement is provided in the cascode stage such that the overall DC gain of the operational amplifier is improved while maintaining good low noise performance with the resistive loads.

Figure 2:
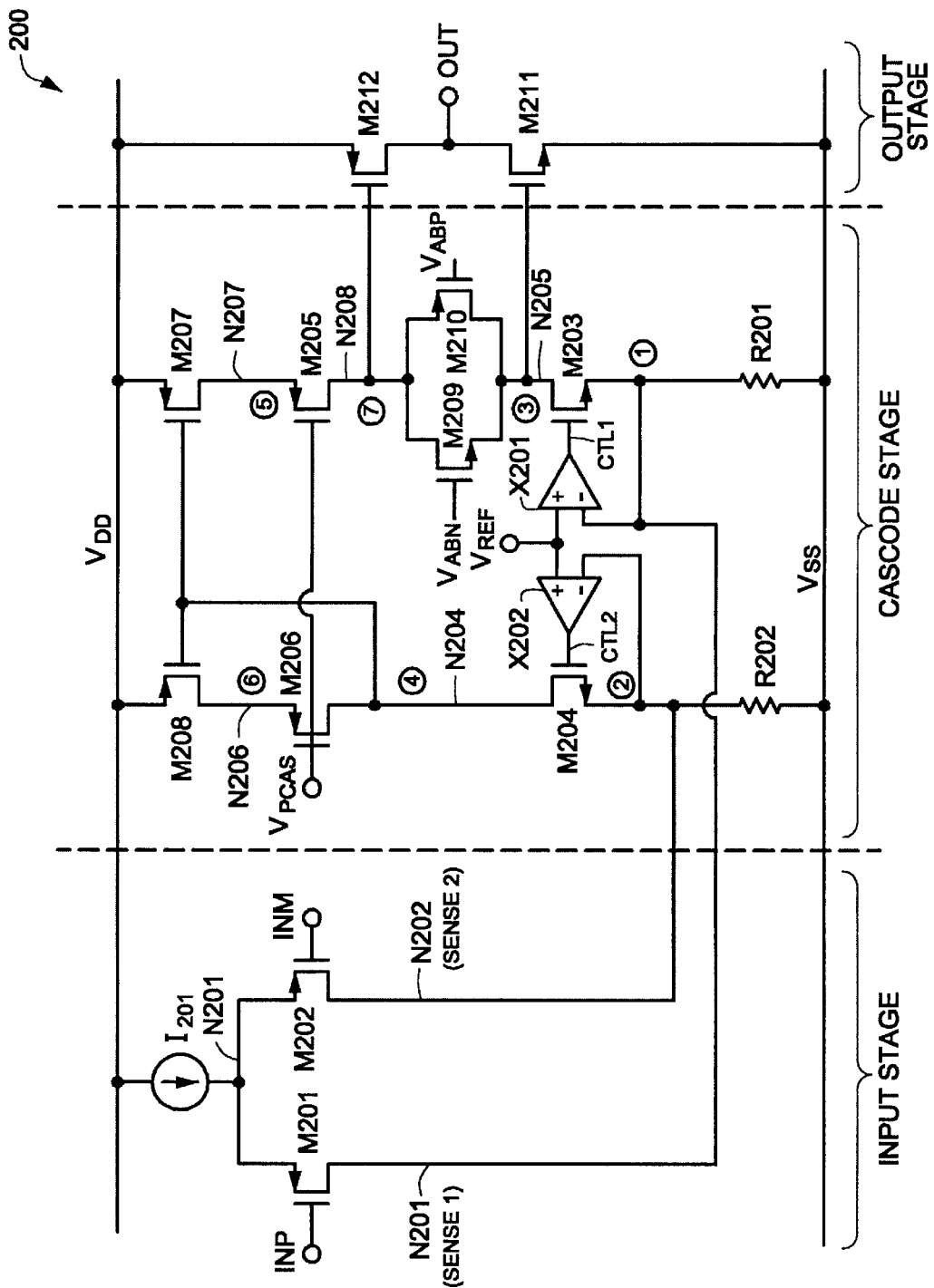
FIG. 2 schematic diagram of an exemplary operational amplifier that is arranged in accordance with the present invention.

FIG. 2 is a schematic diagram of an exemplary operational amplifier (200) that is arranged in accordance with the present invention. The operational amplifier (200) includes twelve transistors (M201–M212), a current source (I201), two resistors (R201–R202), and two amplifier circuits (X201–X202).

Current source I201 is coupled between high power supply VDD and node N201. Transistor M201 includes a source that is coupled to node N201, a gate that is coupled to input terminal INP, and a drain that is coupled to node N203. Transistor M202 includes a source that is coupled to node N201, a gate that is coupled to input terminal INM, and a drain that is coupled to node N202. Resistor R201 is coupled between node N201 and low power supply VSS. Resistor R202 is coupled between node N202 and low power supply VSS. Transistor M203 has a source that is coupled to node N201, a gate that is coupled to control signal CTL1, and a drain that is coupled to node N205. Amplifier circuit X201 has an inverting input that is coupled to node N201, a non-inverting input that is coupled to reference voltage VREF, and an output that provides control signal CTL1. Transistor M204 has a source that is coupled to node N202, a gate that is coupled to control signal CTL2, and a drain that is coupled to node N204. Amplifier circuit X202 has an inverting input that is coupled to node N202, a non-inverting input that is coupled to reference voltage VREF, and an output that provides control signal CTL2. Transistor M206 has a source that is coupled to node N206, a gate that is coupled to signal VPCAS, and a drain that is coupled to node N204. Transistor M208 has a source that is coupled to high power supply VDD, a gate that is coupled to node N204, and a drain that is coupled to node N206. Transistor M209 has a source that is coupled to node N205, a gate that is coupled to bias signal VABN, and a drain that is coupled to node N208. Transistor M210 has a source that is coupled to node N208, a gate that is coupled to bias signal VABP, and a drain that is coupled to node N205. Transistor M205 has a source that is coupled to node N207, a gate that is coupled to bias signal VPCAS, and a drain that is coupled to node N208. Transistor M207 has a source that is coupled to high power supply VDD, a gate that is coupled to node N204, and a drain that is coupled to node N207. Transistor M211 has a source that is coupled to low power supply VSS, a gate that is coupled to node N205, and a drain that is coupled to output terminal OUT. Transistor M212 has a source that is coupled to high power supply VDD, a gate that is coupled to node N208, and a drain that is coupled to output terminal OUT.

Transistors M201 and M202 cooperate with current source I201 to operate as an input stage differential pair circuit. The differential pair circuit is arranged to steer currents to a cascode stage in response to a differential input signal that is applied across the INP and INM input terminals. Transistors M203–M210, resistors R201–R202, and amplifier circuits X201–X202 are arranged to operate as the cascode stage in operational amplifier 200. The cascode stage is arranged to provide an output signal for a subsequent stage of the operational amplifier such as transistors M211 and M212 illustrated in FIG. 2.

Transistor M201 injects current into node N203 when INP is lower than INM. The voltage associated with resistor R201 (sense1) increases as the current flow into node N203 increases. The increased voltage is detected by amplifier X201, which in turn decreases current flow through transistor M203 such that the voltage associated with resistor R201 decreases to the same voltage as reference voltage VREF. Transistors M205–M208 are arranged to operate as a high impedance current mirror. For example, the current drawn by transistor M203 is applied through the high impedance of transistors M205 and M207 to produce a voltage at node N208.

Similarly, transistor M202 injects current into node N202 when INM is lower than INP. The voltage associated with resistor R202 (sense2) increases as the current flow into node N202 increases. The increased voltage is detected by amplifier X202, which in turn decreases current flow through transistor M204 such that the voltage associated with resistor R202 decreases to the same voltage as reference voltage VREF. The current mirror circuit that is formed by transistors M205–M208 detects the current drawn by transistor M204. The voltage associated with node N208 decreases as the current through transistors M203 increases.

Amplifier X201 and transistor M203 are configured to operate as a gain boost circuit (or regulated cascode circuit). Resistor R201 produces a first sense voltage (SENSE1) in response to signal current that is received from transistor M201. Amplifier X201 compares the first sense voltage (SENSE1) to a reference voltage (VREF) and provides a first control signal (CTL1). Transistor M203 is a cascode transistor that is responsive to the first control signal such that the voltage associated with node N203 corresponds to the reference voltage. The voltage at node N203 remains relatively constant such that any increase in signal current into node N203 results in a decrease in current provided by transistor M203, and all of the signal current is absorbed.

Amplifier X202 and transistor M204 are configured to operate as another gain boost circuit (or regulated cascode circuit). Resistor R202 produces a second sense voltage (SENSE2) in response to signal current that is received from transistor M201. Amplifier X202 compares the second sense voltage (SENSE2) to the reference voltage (VREF) and provides a second control signal (CTL2). Transistor M204 is a cascode transistor that is responsive to the second control signal such that the voltage associated with node N202 corresponds to the reference voltage. The voltage at node N202 remains relatively constant such that any increase in signal current into node N202 results in a decrease in current provided by transistor M204, and all of the signal current is absorbed.

Node N201 and N202 are arranged to operate as high impedance nodes. The gain boost circuits are arranged to force the source of cascode transistors M203 and M204 to operate as a low-impedance sources such that the voltage across resistors R201 and R202 are held relatively constant. The signal currents that are introduced into nodes N202 and N201 are completely transferred to the current mirror circuit via the gain boost circuit. The resistor loads (R201, R202) provide improved low noise operation when compared to active load devices. The current mirror circuit is arranged to provide high impedance looking up into nodes N208 and N204, while cascode transistors M203 and M204 provide high impedance looking down into nodes N205 and N204, respectively. The high impedance increases the DC gain of the operational amplifier.

The input stage illustrated in FIG. 2 includes a differential pair that comprises two p-type field effect transistors. However, the differential pair may be implemented as a pair of n-type transistors, p-type transistors, or a composite of n-type transistors and p-type transistors.

The output of the cascode stage corresponds to nodes N208 and node N205. Transistors M209 and M210 are arranged to operate as a floating current source circuit that is part of a trans-linear loop with the output stage. Transistors M209 and M210 are each arranged to compensate for the p-type and n-type output transistors (e.g., M211, M212) in a class AB output stage, such that an appropriate bias is provided to the output stage. Any other appropriate circuit that provides similar finctions may replace the floating current source circuit (transistors M209 and M210).

The cascode stage illustrated in this example includes cascode transistors M205–M206 which are biased by bias signal VPCAS to operate as cascodes for transistors M207–M208, respectively. In an alternative embodiment, transistors M205 and M206 may be eliminated such that the drain of transistor M207 corresponds to node N208, and the gate and drain of transistor M208 are shorted to node N204. Any current mirror circuit may be employed that provides sufficient high impedance for the operational amplifier.

The output stage illustrated in FIG. 2 corresponds to a class AB output stage that is biased by nodes N205 and N208. However, another class AB output stage may be used in place of transistors M211–M212. Alternatively, another output stage may be employed that does not require two drive signals such as, for example, a class A output stage (e.g., M211 is replaced by a current source). In this example, transistors M209 and M210 can be eliminated such that nodes N205 and N208 may be shorted together.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, comprising:
   a first resistor circuit that is coupled between a first node and a power supply, wherein the first resistor circuit has a first sense voltage associated therewith;
   a second resistor circuit that is coupled between a second node and the power supply, wherein the second resistor circuit has a second sense voltage associated therewith;
   a first cascode transistor that is coupled between a third node and the first node, and responsive to a first control signal;
   a second cascode transistor that is coupled between a fourth node and the second node, and responsive to a second control signal;
   a first amplifier circuit that is arranged to provide the first control signal in response to the first sense voltage and a reference voltage;
   a second amplifier circuit that is arranged to provide the second control signal in response to the second sense voltage and the reference voltage; and
   a current mirror circuit that includes a first terminal that is coupled to the third node and a second terminal that is coupled to the fourth node such that the third node operates as a high impedance output node for the cascode stage, whereby high DC gain and low noise performance is achieved.

2. The apparatus in claim 1, wherein the power supply is at least one of a high power supply, and a low power supply.

3. The apparatus in claim 1, wherein the first and second cascode transistors are n-type transistors.

4. The apparatus in claim 1, the current mirror circuit further comprising a first mirror transistor that is coupled between another power supply and the third node and a second mirror transistor that is coupled between the other power supply and the fourth node, wherein the first mirror transistor and the second mirror transistor are arranged to operate as a high impedance current mirror.

5. The apparatus in claim 1, the current mirror circuit further comprising a first mirror transistor that is coupled between another power supply and a fifth node, a third cascode transistor that is coupled between the fifth node and the third node, a second mirror transistor that is coupled between the other power supply and the sixth node, and a fourth cascode transistor that is coupled between the sixth node and the fourth node, wherein the third and forth cascode transistors are biased by a cascode bias signal such that the first mirror transistor and the second mirror transistor are arranged to operate as a high impedance current mirror.

6. The apparatus in claim 1, further comprising a floating current source that includes a first and second terminal, wherein the first terminal of the floating current source is coupled to the first terminal of the current mirror circuit at a fifth node, and wherein the second terminal of the floating current source is coupled to the third node, such that the third node and the fifth node are arranged to operate as class AB output terminals.

7. The apparatus in claim 6, further comprising a first output transistor that is coupled between an other power supply and an output terminal, and a second output transistor that is coupled between the output terminal and the power supply, wherein the first output transistor is responsive to a first output signal that is provided to the fifth node, and wherein the second output transistor is responsive to second output signal that is provided to the third node, such that the first and second output transistors operate as a class AB output stage circuit.

8. The apparatus in claim 1, further comprising a first input transistor and a second input transistor that are arranged to operate as a differential pair circuit with a common node, and a current source that is coupled to the common node, wherein the differential pair circuit is coupled to the first node and the second node.

9. An apparatus, comprising:
- a first resistor circuit that is coupled between a first node and a first power supply, wherein the first resistor circuit has an a first sense voltage associated therewith;
- a second resistor circuit that is coupled between a second node and the first power supply, wherein the second resistor circuit has an a second sense voltage associated therewith;
- a first cascode transistor that is coupled between a third node and the first node, and responsive to a first control signal;
- a second cascode transistor that is coupled between a fourth node and the second node, and responsive to a second control signal;
- a first amplifier circuit that is arranged to provide the first control signal in response to the first sense voltage and a reference voltage;
- a second amplifier circuit that is arranged to provide the second control signal in response to the second sense voltage and the reference voltage;
- a first mirror transistor that is coupled between a second power supply and a fifth node, and includes a control terminal that is coupled to the fourth node;
- a second mirror transistor that is coupled between the second power supply and a sixth node, and includes a control terminal that is coupled to the fourth node;
- a third cascode transistor that is coupled between the fifth node and the third node, and responsive to a cascode bias signal; and
- a fourth cascode transistor that is coupled between the fourth node and the six node, and responsive to the cascode bias signal, whereby high DC gain and low noise performance is achieved.

10. The apparatus of claim 9, further comprising:
- a first p-type transistor that is coupled between a seventh node and the third node, and responsive to a VABP bias signal; and
- a first n-type transistor that is coupled between the seventh node and the third node, and responsive to a first VABN bias signal, wherein the third cascode transistor is coupled to the third node through at least one of the first p-type transistor and the first n-type transistor, wherein the first p-type transistor and the first n-type transistor are configured to operate in a trans-linear loop.

11. The apparatus of claim 10, further comprising:
- a second p-type transistor that is coupled between the second power supply and an output node, and responsive to a first output signal that is provided at the seventh node; and
- a second n-type transistor that is coupled between the output node and the first power supply, and responsive to a second output signal that is provided at the third node, wherein the second p-type transistor and the second n-type transistor are configured to operate as a class AB output stage.

12. A differential amplifier that is arranged to provide an output signal in response to a differential input signal, the differential amplifier comprising:
- a first resistor circuit that is coupled between a first node and a first power supply, wherein the first resistor circuit has a first sense voltage associated therewith;
- a second resistor circuit that is coupled between a second node and the first power supply, wherein the second resistor circuit has a second sense voltage associated therewith;
- a means for mirroring that is arranged to mirror a first mirror current to provide a second mirror current;
- a means for providing a first signal current to the first resistor circuit in response to the differential input signal;
- a means for providing a second signal current to the second resistor circuit in response to the differential input signal;
- a first means for regulating that is arranged to regulate the first sense voltage and provide the first mirror current; and
- a second means for regulating that is arranged to regulate the second sense voltage and provide the second mirror current.

* * * * *

UNITED STATES PATENT AND TRADEMARK OFFICE
CERTIFICATE OF CORRECTION

PATENT NO. : 6,590,452 B1
DATED : July 8, 2003
INVENTOR(S) : Van Rhijn

It is certified that error appears in the above-identified patent and that said Letters Patent is hereby corrected as shown below:

Column 3,
Line 49, "Current source 1201 is" should read -- Current source I201 is --

Column 4,
Line 37, "R201 (sensel) increases" should read -- R201 (sense1) increases --

Column 5,
Line 46, "similar finctions may" should read -- similar functions may --

Column 6,
Line 50, "third and forth" should read -- third and fourth --

Column 7,
Line 15, "circuit has an a first" should read -- circuit has a first --
Line 18, "circuit has an a second" should read -- circuit has a second --
Line 44, "and the six node," should read -- and the sixth node, --

Signed and Sealed this

Twenty-eighth Day of October, 2003

JAMES E. ROGAN
*Director of the United States Patent and Trademark Office*